(12) United States Patent
Yamamoto et al.

(10) Patent No.: US 8,916,854 B2
(45) Date of Patent: Dec. 23, 2014

(54) LIGHT-EMITTING ELEMENT, LIGHT-EMITTING DEVICE, DISPLAY DEVICE, AND ELECTRONIC APPARATUS

(75) Inventors: Hidetoshi Yamamoto, Suwa (JP); Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 136 days.

(21) Appl. No.: 13/407,237

(22) Filed: Feb. 28, 2012

(65) Prior Publication Data

US 2012/0223297 A1 Sep. 6, 2012

(30) Foreign Application Priority Data

Mar. 4, 2011 (JP) ................................. 2011-047273

(51) Int. Cl.
*H01L 51/30* (2006.01)
*H01L 51/50* (2006.01)

(52) U.S. Cl.
CPC .................. *H01L 51/5056* (2013.01)
USPC .................................... 257/40; 257/E51.026

(58) Field of Classification Search
USPC ............................................ 257/40, E51.026
See application file for complete search history.

(56) References Cited

U.S. PATENT DOCUMENTS

| | | | |
|---|---|---|---|
| 5,955,836 | A | 9/1999 | Boerner et al. |
| 5,989,737 | A | 11/1999 | Xie et al. |
| 6,171,715 | B1 | 1/2001 | Sato et al. |
| 6,344,283 | B1 | 2/2002 | Inoue et al. |
| 6,387,546 | B1 | 5/2002 | Hamada et al. |
| 6,692,846 | B2 * | 2/2004 | Hatwar et al. ............. 428/690 |
| 6,750,472 | B2 * | 6/2004 | Suzuki et al. ............... 257/40 |
| 6,831,406 | B1 | 12/2004 | Fukuyama et al. |
| 7,300,731 | B2 * | 11/2007 | Wang ..................... 430/58.35 |
| 2002/0015859 | A1 | 2/2002 | Watanabe et al. |
| 2002/0022149 | A1 | 2/2002 | Watanabe et al. |
| 2002/0086180 | A1 | 7/2002 | Seo et al. |
| 2006/0292394 | A1 | 12/2006 | Iwaki et al. |
| 2007/0172700 | A1 | 7/2007 | Nishita |
| 2010/0140645 | A1 | 6/2010 | Shibata |

FOREIGN PATENT DOCUMENTS

| | | |
|---|---|---|
| JP | A-05-182762 | 7/1993 |
| JP | A-10-106748 | 4/1998 |
| JP | A-10-255985 | 9/1998 |
| JP | A-11-97177 | 4/1999 |
| JP | A-11-345686 | 12/1999 |
| JP | A-2000-323281 | 11/2000 |
| JP | A-2000-340361 | 12/2000 |
| JP | A-2001-284056 | 10/2001 |
| JP | A-2001-313177 | 11/2001 |
| JP | A-2002-313583 | 10/2002 |
| JP | A-2003-077676 | 3/2003 |
| JP | B2-3654909 | 6/2005 |
| JP | A-2007-142011 | 6/2007 |
| JP | A-2007-200938 | 8/2007 |
| JP | A-2008-21665 | 1/2008 |
| JP | A-2009-158756 | 7/2009 |

* cited by examiner

*Primary Examiner* — Roy Potter
(74) *Attorney, Agent, or Firm* — Oliff PLC

(57) ABSTRACT

A light-emitting element includes an anode, a cathode, a luminescent layer that is disposed between the anode and the cathode and emits light by applying a current between the anode and the cathode, and an organic layer that is disposed in contact with the anode and the luminescent layer between the anode and the luminescent layer and functions to transport holes. The organic layer includes a hole injection layer and a hole transport layer. The hole injection layer and the hole transport layer each contain an electron transport material that can transport electrons. The electron transport material content in the hole injection layer is different from that in the hole transport layer.

18 Claims, 5 Drawing Sheets

FIG. 6

| | HOLE INJECTION LAYER | | | | HOLE TRANSPORT LAYER | | | | EVALUATION | | |
|---|---|---|---|---|---|---|---|---|---|---|---|
| | INGREDIENTS | | | AVERAGE THICKNESS (nm) | INGREDIENTS | | | AVERAGE THICKNESS (nm) | DRIVING VOLTAGE (V) | CURRENT DENSITY (mA/cm²) | CHROMATICITY (x, y) | LIFETIME (LT90) NORMALIZED WITH COMPARATIVE EXAMPLE |
| | HOLE INJECTION MATERIAL AND CONTENT (wt%) | ELECTRON TRANSPORT MATERIAL AND CONTENT (wt%) | | | HOLE TRANSPORT MATERIAL AND CONTENT (wt%) | ELECTRON TRANSPORT MATERIAL AND CONTENT (wt%) | | | | | | |
| EXAMPLE 1 | FORMULA (1) 40 | FORMULA (10) 60 | 20 | FORMULA (2) 60 | FORMULA (10) 40 | 50 | 9.8 | 1240 | (0.63, 0.32) | 2.4 |
| EXAMPLE 2 | FORMULA (1) 30 | FORMULA (10) 70 | 20 | FORMULA (2) 60 | FORMULA (10) 40 | 50 | 10.1 | 1280 | (0.66, 0.33) | 2.7 |
| EXAMPLE 3 | FORMULA (1) 50 | FORMULA (10) 50 | 20 | FORMULA (2) 60 | FORMULA (10) 40 | 50 | 9.7 | 1230 | (0.67, 0.33) | 2.3 |
| EXAMPLE 4 | FORMULA (1) 40 | FORMULA (10) 60 | 50 | FORMULA (2) 70 | FORMULA (10) 30 | 20 | 9.7 | 1210 | (0.67, 0.33) | 2.2 |
| EXAMPLE 5 | FORMULA (1) 40 | FORMULA (10) 60 | 20 | FORMULA (2) 60 | FORMULA (10) 40 | 50 | 9.9 | 1270 | (0.67, 0.33) | 2.6 |
| EXAMPLE 6 | FORMULA (2) 40 | FORMULA (10) 60 | 20 | FORMULA (2) 60 | FORMULA (10) 40 | 50 | 9.6 | 1240 | (0.67, 0.33) | 2.5 |
| COMPARATIVE EXAMPLE | FORMULA (1) 100 | — 0 | 20 | FORMULA (2) 100 | — 0 | 50 | 9.5 | 1190 | (0.67, 0.33) | 1.0 |

LIGHT-EMITTING ELEMENT, LIGHT-EMITTING DEVICE, DISPLAY DEVICE, AND ELECTRONIC APPARATUS

BACKGROUND

1. Technical Field

The present invention relates to a light-emitting element, and a light-emitting device, a display device and an electronic apparatus including the light-emitting element.

2. Related Art

An organic electroluminescent element (organic EL element) is a type of light-emitting element and has a structure including a luminescent layer between an anode and a cathode. The luminescent layer includes at least one light-emitting organic layer. In light-emitting elements of this type, electrons and holes are injected to the luminescent layer respectively from the cathode and the anode by applying an electric field between the cathode and the anode, and the electrons and the holes are recombined with each other to form excitons in the luminescent layer. When the excitons return to the ground state, the energy is emitted as light.

In order to enhance the efficiency of hole injection and hole transport in such a light-emitting element, in general, a hole injection layer and a hole transport layer are disposed between the anode and the luminescent layer (for example, Japanese Patent No. 3654909).

In addition, for enhancing the luminous efficiency of the light-emitting element, the levels of the highest occupied molecule orbital (HOMO) and the lowest unoccupied molecule orbital (LUNO) of the hole transport layer are adjusted so that the hole transport layer can block electrons coming from the cathode side (luminescent layer side) to confine electrons and holes in the luminescent layer.

In known light-emitting elements, unfortunately, the hole transport layer cannot sufficiently block electrons, and the electrons gradually enters the hole transport layer in long term use. Consequently, the hole transport layer or the hole injection layer may be degraded by electrons passing therethrough. This problem becomes more pronounced as the driving voltage increases (current density increases), because the ability of the hole transport layer to block electrons is degraded by band bending. It is therefore difficult to increase the lifetime of highly bright light-emitting elements requiring high current density.

In order to enhance the ability to block electrons, it may be effective to use a material having a large energy gap between HOMO and LUMO in the hole transport layer. However, this is not easy in practice because materials that can be used in the hole transport layer are limited.

SUMMARY

Accordingly, the present invention has been made to solve at least part of the above issues, and the following embodiments of the invention can be provided.

According to an aspect of the invention, a light-emitting element is provided which includes an anode, a cathode, a luminescent layer between the anode and the cathode, and an organic layer between the anode and the luminescent layer. The organic layer transports holes, and includes a hole injection layer in contact with the anode and containing a hole injection material, and a hole transport layer in contact with the hole injection layer and the luminescent layer and containing a hole transport material and. The hole injection layer and the hole transport layer each contain an electron transport material that can transport electrons. The electron transport material contents in the hole injection layer and in the hole transport layer are different from each other.

In this light-emitting element, the organic layer, which transports holes, efficiently transports holes from the anode to the luminescent layer. Consequently, the luminous efficiency of the light-emitting element can be enhanced.

Since the organic layer, in this embodiment, contains an electron transport material and is in contact with the anode and the luminescent layer, the organic layer can transport electrons undesirably coming from the luminescent layer toward the anode so as to pass electrons immediately through the organic layer. Thus, electrons cannot stay in the organic layer, and consequently, the organic layer can be prevented from being degraded by electrons. Accordingly, the lifetime of the light-emitting element can be increased even if it is operated at a high current density. In addition, by forming a hole injection layer and a hole transport layer having different electron transport material contents, the light-emitting element can exhibit satisfactory balance between the emission characteristics and the lifetime.

In the above light-emitting element, the organic layer may function to block electrons.

Thus the organic layer can block electrons coming from the luminescent layer while transporting holes from the anode to the luminescent layer. Consequently, electrons and holes can be efficiently confined in the luminescent layer, and thus, the luminous efficiency can be increased.

In general, even if the organic layer of an light-emitting element has the function of blocking electrons, the organic layer cannot block all electrons when the light-emitting element is operated at a high current density. Consequently, electrons may enter (may be injected into) the organic layer. However, in the light-emitting element of the above embodiment of the invention, even if part of the electrons pass through the organic layer, the organic layer can immediately transport incoming electrons toward the anode because of the presence of the electron transport material in the organic layer.

In the light-emitting element of the above embodiment, the electron transport material content in the hole transport layer may be lower than that in the hole injection layer.

In such an organic layer, electrons can be efficiently transported from the luminescent layer to the anode. Thus, the lifetime of the light-emitting element can be increased without increasing the driving voltage.

If the hole transport layer has a lower electron transport material content than the hole injection layer, the hole transport layer may have a larger average thickness than the hole injection layer.

Since the hole injection layer has a higher electron transport material content than the hole transport layer, the mobility of holes in the hole injection layer is likely to be low. Accordingly, the driving voltage is liable to be increased. By increasing the thickness of the hole transport layer relative to the thickness of the hole injection layer, the increase in driving voltage can be suppressed in comparison with the case where the hole injection layer has a thickness more than or equal to the thickness of the hole transport layer.

In this instance, the electron transport material is preferably an acene-based material.

Acene-based materials have a high ability to transport electrons. Accordingly, organic layers containing an acene-based material can immediately transport electrons from the luminescent layer to the anode. In addition, acene-based materials are resistant to electrons. Thus, the degradation of the organic layer by electrons can be prevented or reduced.

In this instance, the organic layer may contain an amine-based material.

Amine-based materials have a high ability to transport holes. Accordingly, organic layers containing an amine-based material can immediately transport holes from the anode to the luminescent layer.

In this instance, the organic layer may contain a mixture of the acene-based material and the amine based material.

Thus, the balance between hole transporting ability and electron transport ability can be relatively easily controlled in an appropriate range.

The acene-based material may be at least one of an anthracene-based material and a naphthacene-based material.

These acene-based materials have a high ability to transport electrons, are highly resistant to electrons, and can relatively easily form a high-quality film.

In the light-emitting element of the above embodiment, the hole transport material in the hole injection layer may be the same as the electron transport material in the hole transport layer.

Thus, the abilities to inject and transport holes from the anode can be good, and the hole injection layer and the hole transport layer can be prevented from being degraded by electrons.

In the light-emitting element, the hole injection layer and the hole transport layer each may contain 30% to 70% by weight of electron transport material.

Thus, the organic layer has a good balance between electron transporting ability and hole transporting ability. In addition, if the organic layer can block electrons, the organic layer can have a good balance between electron booking ability and electron transporting ability.

In the light-emitting element, the organic layer may have an average thickness in the range of 20 to 100 nm.

Thus, the abilities to inject and transport holes from the anode can be good, and the hole injection layer and the hole transport layer can be prevented from being degraded by electrons.

According to another aspect of the invention, a light-emitting device including the above-described light-emitting element is provided.

Since the light-emitting element of the light-emitting device has a long life, the light-emitting device can be reliable.

According to still another aspect of the invention, a display device including the light-emitting device is provided.

The display device can display high-quality images over a long time and is thus reliable.

According to still another aspect of the invention, an electronic apparatus including the display device is provided.

The electronic apparatus is reliable.

BRIEF DESCRIPTION OF THE DRAWINGS

The invention will be described with reference to the accompanying drawings, wherein like numbers reference like elements.

FIG. 6 is a table showing the compositions of the hole injection layer and the hole transport layer of the light-emitting elements prepared in Examples and Comparative Example, and the results of evaluations of emission characteristics.

DESCRIPTION OF EXEMPLARY EMBODIMENTS

Figure 1:
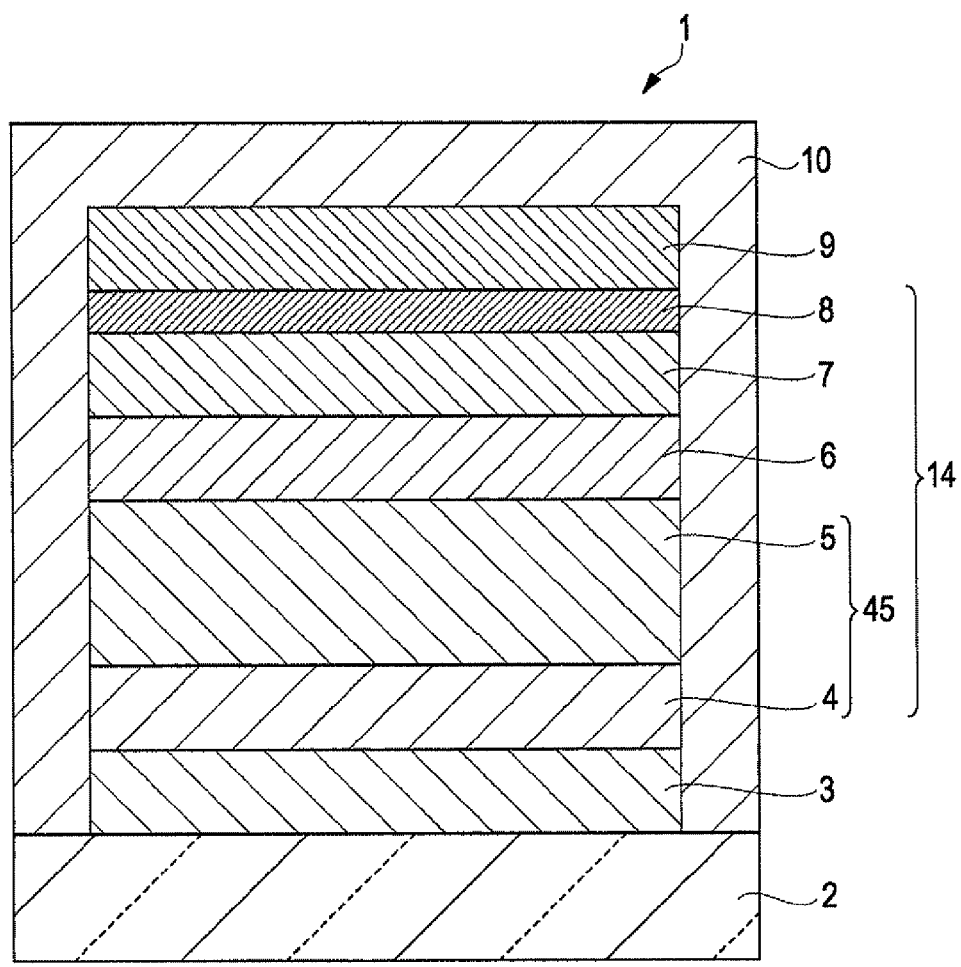
FIG. 1 is a schematic sectional view of a light-emitting element according to an embodiment of the invention.

Preferred embodiments of the light-emitting element, the light-emitting device, the display device, and the electronic apparatus of the invention will now be described with reference to the attached drawings. For the sake of visibility, the dimensional proportions of the layers and other members in the drawings may be different from those in practice.

FIG. 1 is a schematic sectional view of a light-emitting element according to an embodiment of the invention. In the following description, the upper side of FIG. 1 is described as the upper side of the structure of the light-emitting element, and similarly the lower side of the figure is described as the lower side of the structure.

The light-emitting element (electroluminescent element) 1 shown in FIG. 1 includes an anode 3, a hole injection layer 4, a hole transport layer 5, a luminescent layer 6, an electron transport layer 7, an electron injection layer 8, and a cathode 9, and these layers are formed in that order. In other words, the light-emitting element 1 has a multilayer composite 14 including the hole injection layer 4, the hole transport layer 5, the luminescent layer 6, the electron transport layer 7 and the electron injection layer 8 that are formed in that order in the direction from the anode 3 to the cathode 9, and the multilayer composite 14 is disposed between the anode 3 and the cathode 9. In the present embodiment, the hole injection layer 4 and the hole transport layer 5 constitute a function layer 45 that corresponds to an organic layer functioning to transport holes from the anode 3 to the luminescent layer 6.

The entirety of the light-emitting element 1 is disposed on a substrate 2 and sealed with a sealing member 10.

In the light-emitting element 1, by applying a driving voltage to the anode 3 and the cathode 9, electrons are supplied (injected) to the luminescent layer 6 from the cathode 9, and holes are supplied (injected) to the luminescent layer 6 from the anode 3. The holes and the electrons are recombined in the luminescent layer 6. The energy generated by the recombination forms excitons. When the excitons return to the ground state, energy is emitted as light (fluorescence or phosphorescence). The light-emitting element 1 thus emits light.

When the light-emitting element 1 emits light, the function layer (organic layer) 45 including the hole injection layer 4 and the hole transport layer 5 can efficiently transport holes from the anode 3 to the luminescent layer 6. Consequently, the luminous efficiency of the light-emitting element 1 can be enhanced.

In particular, in the light-emitting element 1 of the present embodiment, the function layer 45 including the hole injection layer 4 and the hole transport layer 5 contains an electron transport material, as will be described later, and is in contact with the anode 3 and the luminescent layer 6. Therefore, even if electrons enters (are injected into) the hole transport layer 5 from the luminescent layer 6, the hole injection layer 4 and the hole transport layer 5 immediately transport the electrons to the anode 3, thus passing the electrons therethrough. Thus, the hole injection layer 4 and the hole transport layer 5 prevent electrons from staying therein, and consequently, the hole injection layer 4 and the hole transport layer 5 are prevented from being degraded by electrons. Accordingly, the lifetime of the light-emitting element 1 can be increased even if it is operated at a high current density. In addition, by forming a hole injection layer 4 and a hole transport layer 5 having different electron transport material contents, the light-emitting element 1 can exhibit satisfactory balance between the emission characteristics and the lifetime.

The substrate 2 supports the anode 3. The light-emitting element 1 of the present embodiment is of bottom emission type, in which light is emitted through the substrate 2. Accordingly, the substrate 2 and the anode 3 are substantially transparent (clear and colorless, clear and colored, or translucent).

For example, the substrate 2 may be made of a resin, such as polyethylene terephthalate, polyethylene naphthalate, polypropylene, cycloolefin polymer, polyamide, polyethersulfone, poly(methyl methacrylate), polycarbonate, or polyacrylate, or a glass material, such as quartz glass or soda glass. These materials may be used singly or in combination.

The substrate 2 preferably has an average thickness of, but not limited to, about 0.1 to 30 mm, more preferably about 0.1 to 10 mm.

If the light-emitting element 1 is of top emission type, in which light is emitted from the opposite side to the substrate 2, the material of the substrate 2 may be transparent or opaque.

Such an opaque substrate may be made of a ceramic such as alumina, a metal coated with an oxide film (insulating film) such as stainless steel, or a resin.

In the light-emitting element 1 of the present embodiment, the distance between the anode 3 and the cathode 9 (average thickness of the multilayer composite 14) is preferably 100 to 300 nm, more preferably 100 to 250 nm, and still more preferably 100 to 200 nm. Thus, the driving voltage of the light-emitting element 1 can be easily and reliably reduced.

Components constituting the light-emitting element 1 will be described below.

Anode

The anode 3 is an electrode that injects holes to the luminescent layer 6 through the hole injection layer 4, which will be described later. Preferably, the anode 3 is made of a material having a high work function and a high conductivity.

The anode 3 may be made of oxides such as indium tin oxide (ITO), indium zinc oxide (IZO), $In_2O_3$, $SnO_2$, Sb-containing $SnO_2$, and Al-containing ZnO, metals such as Au, Pt, Ag, and Cu, and alloys containing these metals. These materials may be used singly or in combination.

Preferably, the anode 3 is made of ITO. ITO is transparent and has a high work function and a high conductivity. Electrons thus can be efficiently injected from the anode 3 to the hole injection layer 4.

In addition, the surface (upper surface in FIG. 1) of the anode 3 at the hole injection layer 4 side is preferably subjected to plasma treatment. The chemical and mechanical stability of the joint surface between the anode 3 and the hole injection layer 4 thus can be enhanced. Consequently, holes can be more efficiently injected from the anode 3 to the hole injection layer 4. The above-mentioned plasma treatment will be described in detail in a description of a manufacturing method of the light-emitting element 1 later.

The anode 3 preferably has an average thickness of, but not limited to, about 10 to 200 nm, more preferably about 50 to 150 nm.

Cathode

The cathode 9 is an electrode that injects electrons to the electron transport layer 7 through the electron injection layer 8. Preferably, the cathode 9 is made of a material having a low work function.

Examples of the material of the cathode 9 include Li, Mg, Ca, Sr, La, Ce, Er, Eu, Sc, Y, Yb, Ag, Cu, Al, Cs, Rb, and alloys containing these metals. These materials may be used singly, or in combination (in a form of a multilayer composite or a layer made of a mixture).

If the cathode 9 is made of an alloy, it is preferable that an alloy containing a stable metallic element, such as Ag, Al or Cu, be used. More specifically, alloys such as MgAg, AlLi and CuLi are preferred. These alloys can enhance the electron injection efficiency and stability of the cathode 9.

The cathode 9 preferably has an average thickness of, but not limited to, about 50 to 1000 nm, more preferably about 100 to 500 nm.

Since the light-emitting element 1 of the present embodiment is of bottom emission type, the cathode 9 does not need to be optically transparent.

Hole Injection Layer

The hole injection layer 4 enhances the efficiency of hole injection from the anode 3, that is, has an ability to inject holes. In addition, the hole injection layer 4 can transport electrons, as will be described later.

The hole injection layer 4 contains a material that can inject holes (hole injection material) and a material that can transport electrons (electron transport material). The electron transport material in the hole injection layer 4 will be described later with the electron transport material in the hole transport layer 5.

The hole injection material in the hole injection layer 4 is not particularly limited, and may be copper phthalocyanine, 4,4',4"-tris(N,N-phenyl-3-methylphenylamino)triphenylamine (m-MTDATA), or N,N'-bis-(4-diphenylamino-phenyl)-N,N'-diphenyl-biphenyl-4-4'-diamine expressed by the following formula (1):

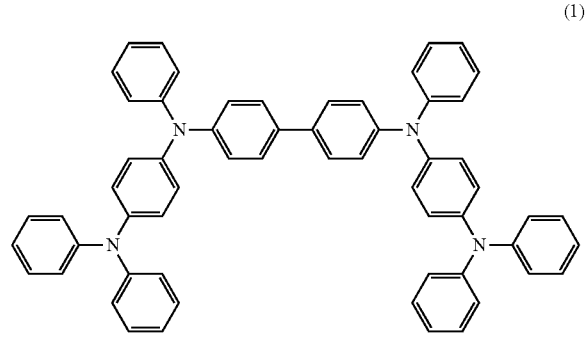 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]

(1)

The hole injection material in the hole injection layer 4 is preferably an amine-based material, and more preferably a diaminobenzene derivative, a benzidine derivative (material having a benzidine skeleton), a triamine compound having both a diaminobenzene unit and a benzidine unit in the molecule or a tetraamine compound, from the viewpoint of hole injection ability and hole transporting ability.

The hole injection layer 4 preferably has an average thickness of, but not limited to, about 5 to 90 nm, more preferably about 10 to 70 nm.

Hole Transport Layer

The hole transport layer 5 transports holes injected through the hole injection layer 4 from the anode 3 to the luminescent layer 6, and hence, the hole transport layer 5 has an ability to transport holes. In addition, the hole transport layer 5 can transport electrons, as will be described later.

The hole transport layer 5 contains a material that can transport holes (hole transport material) and a material that can transport electrons (electron transport material). The electron transport material in the hole transport layer will be described later with the electron transport material in the hole injection layer 4.

The hole transport material in the hole transport layer 5 may be a p-type polymer material, a p-type low-molecular-weight material, or a combination of these materials. Examples of such a hole transport material include tetraaryl-benzidine derivatives, such as N,N'-di(1-naphthyl)-N,N'-diphenyl-1,1'-diphenyl-4,4'-diamine (NPD) expressed by the following formula (2) and N,N'-diphenyl-N,N'-bis(3-methylphenyl)-1,1'-diphenyl-4,4'-diamine (TPD), and tetraaryl-diaminofluorene compounds and their derivatives (amine-based compounds). These materials may be used singly or in combination.

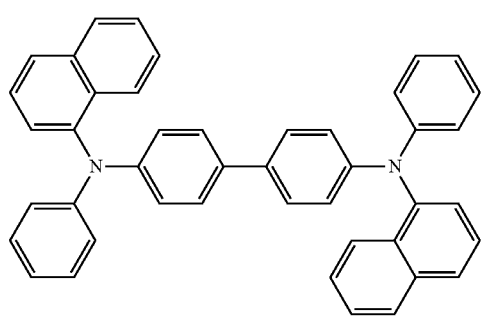

(2)

The hole transport material in the hole transport layer 5 is preferably an amine-base material, and more preferably a benzidine derivative (material having a benzidine skeleton) because they have high hole inject ability and high hole transporting ability.

In addition, the hole transport material preferably has a band gap (difference in energy between the HOMO level and the LUMO level) to block electrons coming from the luminescent layer 6. Hence, it is preferable that function layer 45, including the hole injection layer 4 and the hole transport layer 5, function to block electrons.

Thus, the hole injection layer 4 and the hole transport layer 5 transport holes from the anode 3 to the luminescent layer 6 and, in addition, blocks electrons coming from the luminescent layer 6. Consequently, electrons and holes are efficiently confined in the luminescent layer 6, and thus, the luminous efficiency can be increased.

When the light-emitting element 1 is operated at a high current density, however, the hole transport layer 5 cannot block all electrons even though the hole transport layer 5 functions to block electrons, and electrons may enter (may be injected into) the hole transport layer 5. Accordingly, the hole injection layer 4 and the hole transport layer 5 of the light-emitting element 1 each contain an electron transport material, so that electrons coming through the hole transport layer 5 without being blocked by the hole transport layer 5 can be immediately transported to the anode 3.

The hole transport layer 5 preferably has an average thickness of, but not limited to, about 10 to 90 nm, more preferably about 30 to 70 nm.

Electron Transport Materials in Hole Injection Layer and Hole Transport Layer

The electron transport materials in the hole injection layer 4 and the hole transport layer 5 will now be described in detail.

The function layer 45 of the light-emitting element 1 of the present embodiment, which includes the hole injection layer 4 and the hole transport layer 5, is an organic layer disposed in contact with the anode 3 and the luminescent layer 6 between them and functioning to transport holes.

The hole injection layer 4 and the hole transport layer 5 each contain an electron transport material. Hence, the organic layer or function layer 45, including the hole injection layer 4 and the hole transport layer 5, contains an electron transport material that can transport electrons.

Consequently, the function layer 45 can enhance abilities to inject and transport holes from the anode 3, and the hole injection layer 4 and the hole transport layer 5 can be prevented from being degraded by electrons.

More specifically, the function layer 45 including the hole injection layer 4 and the hole transport layer 5 can efficiently transport holes from the anode 3 to the luminescent layer 6. Consequently, the luminous efficiency of the light-emitting element 1 can be enhanced.

In particular, in the light-emitting element 1 of the present embodiment, the hole injection layer 4 and the hole transport layer 5, constituting the function layer 45, each contain an electron transport material, and the function layer 45 is in contact with the anode 3 and the luminescent layer 6. Therefore, even if electrons enter (are injected into) the hole transport layer 5 from the luminescent layer 6, the hole injection layer 4 and the hole transport layer 5 immediately transport the electrons to the anode 3, thus passing the electrons therethrough. Thus, the hole injection layer 4 and the hole transport layer 5 prevent electrons from staying therein, and consequently, the hole injection layer 4 and the hole transport layer 5 can be prevented from being degraded by electrons. Accordingly, the lifetime of the light-emitting element 1 can be increased even if it is operated at a high current density.

Since electron transport materials are resistant to electrons, the electron transport material in the hole injection layer 4 or the hole transport layer 5 is hardly degraded by electrons passing through the hole injection layer 4 or the hole transport layer 5. In addition, since electrons in the hole injection layer 4 and the hole transport layer 5 are transported mainly by being transmitted through the electron transport material rather than the hole transport material or the hole injection material, the hole injection material in the hole injection layer 4 and the hole transport material in the hole transport layer 5 can be prevented from being degraded by electrons.

Any known electron transport material can be used as the electron transport material in the hole injection layer 4 and the hole transport layer 5 as long as it can transport electrons. Examples of the electron transport material include acene-based materials, quinoline derivatives such as tris(8-quinolinolato) aluminum ($Alq_3$) and other organic metal complexes including 8-quinolinol or its derivatives as a ligand, azaindolizine derivatives, oxadiazole derivatives, perylene derivatives, pyridine derivatives, pyrimidine derivatives, quinoxaline derivatives, diphenylquinone derivatives, and nitro-substituted fluorene derivatives. These materials may be used singly or in combination.

Among these materials, acene-based materials are suitable as the electron transport material of the hole injection layer 4 and the hole transport layer 5. Acene-based materials have a high electron transporting ability, and, in addition, a hole transporting ability. Therefore, the hole injection layer 4 and the hole transport layer 5, containing an acene-based material, can immediately transport electrons from the luminescent layer 6 to the anode 3. In addition, acene-based materials are resistant to electrons and holes. Consequently, the degradation of the hole injection layer 4 and the hole transport layer 5 by electrons can be prevented or reduced.

The acene-based material used in the present embodiment has an acene skeleton and has the above functions, and is otherwise limited. Preferred examples of such an acene-based material include naphthalene derivatives, anthracene derivatives, naphthacene derivatives (tetracene derivatives), pentacene derivative, hexacene derivatives, and heptacene derivatives. These materials may be used singly or in combination. Among these, anthracene derivatives and naphthacene derivatives are preferred, and anthracene derivatives, particularly, having a mono-anthracene or a bis-anthracene as the main skeleton is more preferred.

Anthracene derivatives are superior in transporting electrons and can form a film by a simple gas-phase deposition. Accordingly, the use of an anthracene derivative as the acene-based material can impart a high electron transporting ability to the hole injection layer 4 and the hole transport layer 5, and allows simple formation of a homogeneous hole injection layer 4 and hole transport layer 5.

Preferably, the hole injection layer 4 and the hole transport layer 5 each contain an amine-based material. Amine-based materials have high hole transporting ability. Therefore, the function layer or organic layer 45 including the hole injection layer 4 and hole transport layer 5 containing an amine-based material can immediately transport holes from the anode 3 to the luminescent layer 6.

In this instance, preferably, the hole injection layer 4 and the hole transport layer 5 are each made of a mixture of an acene-based material and an amine-based material. Thus, the balance between the hole transporting ability and the electron transporting ability of the function layer 45 including the hole injection layer 4 and the hole transport layer 5 can be relatively easily controlled in an appropriate range.

The electron transport material in the hole injection layer 4 and the hole transport layer 5 may be a dielectric hydrocarbon, which is composed of carbon and hydrogen. Dielectric hydrocarbons have relatively low dielectric constants and dielectric loss tangents, exhibiting high dielectric properties. Such a compound does not have a polar group, such as hydroxy group or carboxyl group, and is accordingly less reactive and relatively chemically stable. Also, it is less interactive with hole injection materials or hole transport materials. Consequently, the performance of the light-emitting element 1 can be maintained at a high level over a long time.

The electron transport materials in the hole injection layer 4 and the hole transport layer 5 may be the same or different.

Preferably, the electron transport material has as high a glass transition temperature (Tg) as possible. For example, it is 120° C. or more, and more preferably 150° C. or more. Thus, the performance of the light-emitting element 1 is not degraded by heat even if the light-emitting element 1 is operated at a high current density and heated to a high temperature.

Preferably, the electron transport material contents in the hole injection layer 4 and the hole transport layer 5 are each in the range of 30% to 70% by weight, and more preferably in the range of 40% to 60% by weight. Thus, the function layer 45 including the hole injection layer 4 and the hole transport layer 5 can be controlled so as to have a good balance between electron transporting ability and hole transporting ability. In addition, if the function layer 45 can block electrons, it can have a good balance between electron blocking ability and electron transporting ability.

However, if the electron transport material content is lower than the lower limit of the above range, the electron transport material in the hole injection layer 4 and the hole transport layer 5 is liable to be excited to emit light undesirably, and consequently, may adversely affect the emission spectrum of the light-emitting element 1. In contrast, if the electron transport material content exceeds the upper limit of the above range, the total thickness of the layers of the light-emitting element 1 is increased excessively, and consequently, the driving voltage of the light-emitting element 1 is likely to increase.

Preferably, the electron transport material contents in the hole injection layer 4 and the hole transport layer 5 are different.

Preferably, the electron transport material contents in the hole transport layer 5 is lower than that in the hole injection layer 4. The electron transporting ability and electron injection ability thus can be enhanced at the interface between the hole transport layer 5 and the luminescent layer 6, while the increase of the driving voltage of the light-emitting element 1, which is caused by the degradation of hole transporting ability, can be prevented.

Preferably, the average thickness of the function layer 45 including the hole injection layer 4 and the hole transport layer 5 (total thickness of the hole injection layer 4 and the hole transport layer 5) is in the range of 20 to 100 nm, more preferably in the range of 30 to 80 nm, and still more preferably in the range of 30 to 70 nm. Thus the hole injection layer 4 and the hole transport layer 5 can be prevented from being degraded by electrons without increasing the driving voltage. In addition, an optical gap facilitating light extraction into the light-emitting element 1 can be easily formed.

If the average thickness of the function layer 45 is lower than the lower limit of the above ranges, however, the hole injection ability of the hole injection layer 4 or the hole transporting ability of the hole transport layer 5 may be degraded, depending on the thicknesses or the materials of the hole injection layer 4 and hole transport layer 5. In contrast, if the average thickness exceeds the upper limit of the above ranges, it becomes difficult to form an optical gap, and the driving voltage of the light-emitting element 1 is likely to increase.

Preferably, the average thickness of the hole transport layer 5 is larger than that of the hole injection layer 4. The hole transporting abilities of the hole injection layer 4 and the hole transport layer 5 thus can be prevented from being reduced, and the increase of the driving voltage of the light-emitting element 1 can be suppressed.

Luminescent Layer

When a current is applied between the anode 3 and the cathode 9, the luminescent layer 6 emits light. The luminescent layer 6 contains a luminescent material. Any luminescent material can be used without particular limitation. Fluorescent materials and phosphorescent materials may be used singly or in combination.

Exemplary red fluorescent materials include, but are not limited to, perylene derivatives such as the tetraaryldiindenoperylene derivative expressed by the following formula (3), europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizine-9-yl) ethenyl)-4H-pyran-4H-ylidene)propanedinitrile (DCJTB), and 4-(dicyanomethylene)-2-methyl-6-(p-dimethylaminostyryl)-4H-pyran (DCM).

(3)

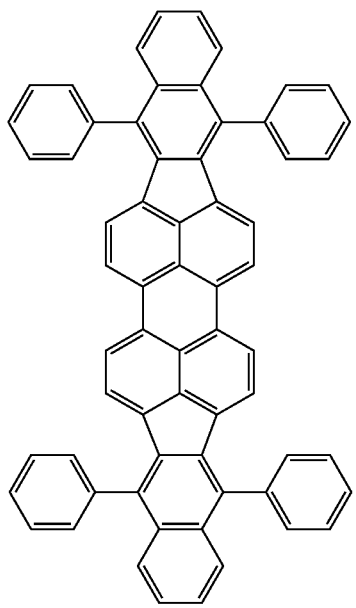

Exemplary red phosphorescent materials include, but are not limited to, metal complexes, such as those of iridium, ruthenium, platinum, osmium, rhenium and palladium. At least one of the ligands of the metal complex may have a phenylpyridine skeleton, a bipyridyl skeleton, a porphyrin skeleton or the like. More specifically, examples of such a red phosphorescent material include tris(1-phenylisoquinoline) iridium, bis[2-(2'-benzo[4,5-α]thienyl)pyridinato-N,$C^{3'}$]iridium (acetylacetonate)(btp2Ir(acac)), 2,3,7,8,12,13,17,18-octaethyl-12H-23H-porphyrin-platinum (II), bis[2-(2'-benzo[4,5-α]thienyl)pyridinato-N,$C^{3'}$]iridium, and bis(2-phenylpyridine)iridium(acetylacetonate).

Exemplary blue fluorescent materials include, but are not limited to, distyrylamine derivatives such as the distyryldiamine compound expressed by the following formula (4), fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis (9-ethyl-3-carbazovinylene)-1,1'-biphenyl (ECzVBi), poly [(9,9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}phenylene-1,4-diyl)], and poly[(9,9-dioctylfluorene-2,7-diyl)-co-(ethylenylbenzene)]. These materials may be used singly or in combination.

(4)

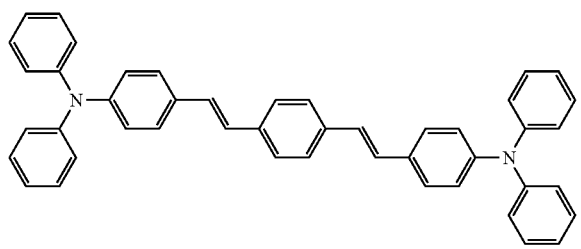

Exemplary blue phosphorescent materials include, but are not limited to, metal complexes, such as those of iridium, ruthenium, platinum, osmium, rhenium and palladium. More specifically, examples of such a blue phosphorescent material include bis[4,6-difluorophenylpyridinato-N,$C^{2'}$]-picolinate-iridium, tris[2-(2,4-difluorophenyl)pyridinato-N,$C^{2'}$]iridium, bis[2-(3,5-trifluoromethyl)pyridinato-N,$C^{2'}$]-picolinate-iridium, and bis(4,6-difluorophenylpyridinato-N,$C^{2'}$) iridium(acetylacetonate).

Exemplary green fluorescent materials include, but are not limited to, coumarin derivatives, quinacridone and quinacridone derivatives such as the quinacridone derivative expressed by the following formula (5), 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-(2-methoxy-5-(2-ethoxylhexyloxy)-1,4-phenylene)].

(5)

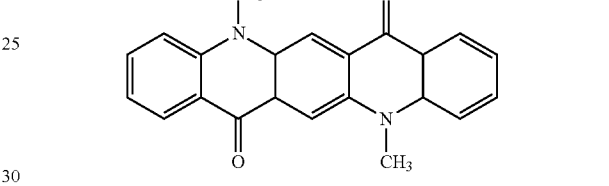

Exemplary green phosphorescent materials include, but are not limited to, metal complexes, such as those of iridium, ruthenium, platinum, osmium, rhenium and palladium. Among these, preferred are metal complexes at least one ligand of which has a phenylpyridine skeleton, a bipyridyl skeleton, a porphyrin skeleton or the like. More specifically, examples of such a metal complex include fac-tris(2-phenylpyridine) iridium (Ir(ppy)₃), bis(2-phenylpyridinato-N, $C^{2'}$)iridium(acetylacetonate), and fac-tris[5-fluoro-2-(5-trifluoromethyl-2-pyridine)phenyl-C,N]iridium.

Exemplary yellow fluorescent materials include compounds having a naphthacene skeleton, formed by substituting naphthacene with a desired number (preferably 2 to 6) of aryl groups (preferably, phenyl groups), such as rubrene-based materials, and mono-indenoperylene derivatives.

Those luminescent materials (fluorescent materials and phosphorescent materials) may be used singly or in combination. If two or more of luminescent materials are used in combination, the luminescent layer 6 may have a multilayer structure including layers containing different luminescent materials, or may be defined by a layer made of a mixture of a plurality of luminescent materials. If the luminescent layer 6 includes a plurality of layers, each of the luminescent layers may be separated by an intermediate layer that is not involved in light emission.

The luminescent layer 6 may further contain a host material so that the luminescent material acts as a guest material (dopant). The host material helps the recombination of holes and electrons to form excitons, and transfers the energy of the excitons to the luminescent material (Ferster transfer or Dexter transfer) to excite the luminescent material. The host material may be doped with the guest material or luminescent material.

Any host material can be used without particular limitation as long as it acts as above on the luminescent material. If the luminescent material is fluorescent, examples of the host material include distyrylarylene derivatives, naphthacene derivatives, the compound expressed by the following formula (6), anthracene derivatives such as 2-t-butyl-9,10-di(2-naphthyl)anthracene (TBADN), perylene derivatives, distyrylbenzene derivatives, distyrylamine derivatives, quinolinolate-based metal complexes such as tris(8-quinolinolato) aluminum complexes ($Alq_3$), triarylamine derivatives such as triphenylamine tetramers, oxadiazole derivatives, rubrene and rubrene derivatives such as the compound expressed by the following formula (7), silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVEi). These materials may be used singly or in combination.

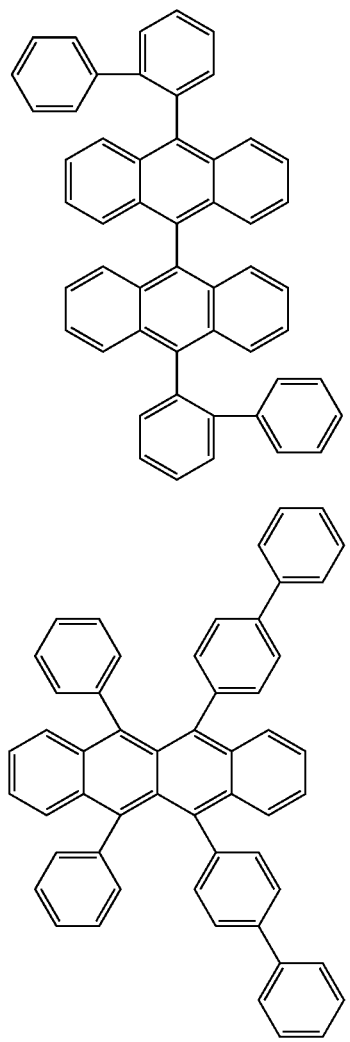

(6)

(7)

If the host material is phosphorescent, examples of the host material include carbazole derivatives, such as 3-phenyl-4-(1'-naphthyl)-5-phenylcarbazole and 4,4'-N,N'-dicarbazolebiphenyl (CBP). These compounds may be used singly or in combination.

In the case where the luminescent layer 6 contains a host material, the luminescent material content (amount of dopant) in the luminescent layer 6 is preferably 0.01% to 20% by weight, and more preferably 0.1% to 10% by weight. By controlling the luminescent material content in these ranges, the luminous efficiency can be optimized.

The luminescent layer 6 preferably has an average thickness of, but not limited to, about 1 to 60 nm, more preferably about 3 to 50 nm.

Electron Transport Layer

The electron transport layer 7 transports electrons injected through the electron injection layer 8 from the cathode 9 to the luminescent layer 6.

The electron transport layer 7 contains an electron transport material. Examples of the electron transport material include quinoline derivatives such as tris(8-quinolinolato) aluminum ($Alq_3$) expressed by the following formula (8) and other organic metal complexes including 8-quinolinol or its derivatives as a ligand, azaindolizine derivatives such as the compound expressed by the following formula (9), oxadiazole derivatives, perylene derivatives, pyridine derivatives, pyrimidine derivatives, quinoxaline derivatives, diphenylquinone derivatives, and nitro-substituted fluorene derivatives. These compounds may be used singly or in combination.

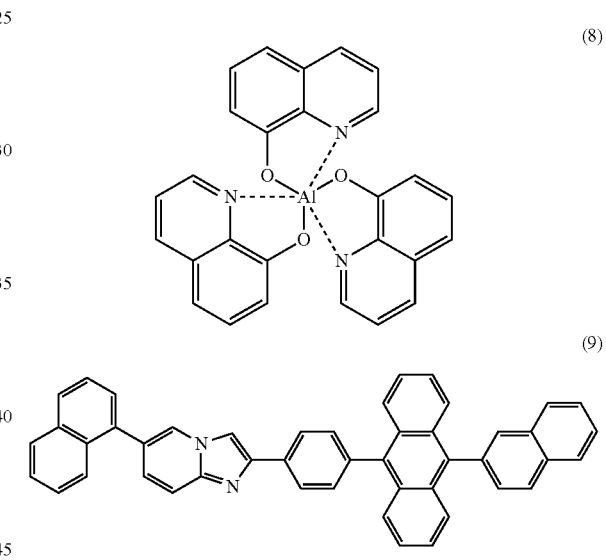

(8)

(9)

If the electron transport layer 7 contains two or more electron transport materials, it may be made of a mixture of two or more electron transport materials, or may include two or more layers made of different electron transport materials.

For an electron transport layer 7 having a multilayer structure made of different electron transport materials, the layer closest to the anode (first electron transport layer) is made of a material that can inject electrons to the luminescent layer 6, and is preferably made of, for example, an anthracene derivative, an quinoline derivative such as tris(8-quinolinolato) aluminum ($Alq_3$) or any other organic metal complex including 8-quinolinol or its derivative as a ligand. The layer closest to the cathode (second electron transport layer) is made of a material that allows the electron injection layer 8 to receive electrons and inject the electrons to the first electron transport layer, and is preferably made of, for example, an azaindolizine derivative such as the compound expressed by the above formula (9), a pyridine derivative, or a phenanthroline derivative.

Preferably, the first electron transport layer has a smaller average thickness than the second electron transport layer, and more preferably, the average thickness of the first electron transport layer is 0.1 to 0.4 times that of the second electron transport layer. The electron transporting ability and electron injection ability of the electron transport layer 7 thus can be enhanced.

The average thickness of the electron transport layer 7 is preferably, but is not limited to, about 0.5 to 100 nm, and more preferably about 1 to 50 nm.

Electron Injection Layer

The electron injection layer 8 enhances the efficiency of electron injection from the cathode 9.

The electron injection layer 8 contains an electron injection material such as an inorganic insulating material or an inorganic semiconductor material.

Exemplary inorganic insulating materials include alkali metal chalcogenides (oxides, sulfides, selenides, tellurides), alkaline-earth metal chalcogenides, alkali metal halides and alkaline-earth metal halides. These materials may be used singly or in combination. The electron injection layer 8 mainly containing such an inorganic insulating material can exhibit higher electron injection ability. In particular, alkali metal compounds (such as alkali metal chalcogenides and alkali metal halides) have very low work functions. By using such a material in the electron injection layer 8, the light-emitting element 1 can emit light with a high luminance.

Exemplary alkali metal chalcogenides include $Li_2O$, LiO, $Na_2S$, $Na_2Se$, and NaO. Exemplary alkaline-earth metal chalcogenides includes CaO, BaO, SrO, BeO, BaS, MgO, and CaSe. Exemplary alkali metal halides include CsF, LiF, NaF, KF, LiCl, KCl, and NaCl. Exemplary alkaline-earth metal halides include $CaF_2$, $BaF_2$, $SrF_2$, $mgF_2$, and $BeF_2$. Examples of the inorganic semiconductor material of the electron injection layer 8 include oxides, nitrides and oxynitrides containing at least one selected from the group consisting of Li, Na, Ba, Ca, Sr, Yb, Al, Ga, In, Cd, Mg, Si, Ta, Sb and Zn. These materials may be used singly or in combination.

The electron injection layer 8 preferably has an average thickness of, but not limited to, about 0.1 to 500 nm, more preferably about 0.2 to 100 nm, and still more preferably about 0.2 to 10 nm.

Sealing Member

The sealing member 10 covers the anode 3, the multilayer composite 14 and the cathode 9 to seal them for air tightness, and blocks oxygen and moisture. The presence of the sealing member 10 enhances the reliability of the light-emitting element 1 and prevents the deterioration or alteration of the light-emitting element 1 to enhance the durability.

The sealing member 10 may be made of a metal such as Al, Au, Cr, Nb, Ta, Ti or an alloy containing these elements, silicon oxide, or a resin material. If the sealing member 10 is electrically conductive, it is preferable that an insulating film be optionally provided between the sealing member 10 and each of the anode 3, the multilayer composite 14 and the cathode 9 to prevent short-circuiting.

The sealing member 10 may be flat and oppose the substrate 2 with a sealant of, for example, a thermosetting resin filling the space therebetween.

In the light-emitting element 1 having such a structure, the function layer or organic layer 45 including the hole injection layer 4 and the hole transport layer 5 can efficiently transport holes from the anode 3 to the luminescent layer 6. Consequently, the luminous efficiency of the light-emitting element 1 can be enhanced.

In particular, in the light-emitting element 1 of the present embodiment, the hole injection layer 4 and the hole transport layer 5, constituting the function layer 45, each contain an electron transport material, and the function layer 45 is in contact with the anode 3 and the luminescent layer 6. Therefore, even if electrons enter (are injected into) the hole transport layer 5 from the luminescent layer 6, the hole injection layer 4 and the hole transport layer 5 immediately transport the electrons to the anode 3, thus passing the electrons therethrough. Thus, the hole injection layer 4 and the hole transport layer 5 prevent electrons from staying therein, and consequently, the hole injection layer 4 and the hole transport layer 5 can be prevented from being degraded by electrons. In addition, the electron transport material content in the hole transport layer 5 is smaller than that in the hole injection layer 4. Consequently, the hole transport layer 5 can be prevented effectively from being degraded by electrons, while the increase of the driving voltage of the light-emitting element 1, which is caused by the degradation of hole transporting ability, can be prevented. Accordingly, the lifetime of the light-emitting element 1 can be increased even if it is operated at a high current density.

The light-emitting element 1 may be manufactured in the following process.

(1) First, a substrate 2 is prepared, and an anode 3 is formed on the substrate 2. The anode 3 can be formed by chemical vapor deposition (CVD) such as plasma CVD or thermal CVD, dry plating such as vacuum vapor deposition, wet plating such as electroplating, spraying, thermal spraying, sol-gel method, metal organic deposition (MOD), or metal foil bonding.

(2) Then, a hole injection layer 4 is formed on the anode 3. The hole injection layer 4 can be formed by a gas phase process using, for example, CVD or dry plating such as vacuum vapor deposition or sputtering.

Alternatively, the hole injection layer 4 may be formed by applying a hole injection layer-forming material onto the anode 3 and drying the material (removing the solvent or disperse medium). The hole injection layer-forming material can be prepared by dissolving a hole injection material in a solvent or dispersing it in a disperse medium.

The hole injection layer-forming material may be applied by a coating method, such as spin coating, roll coating, or ink jet printing. Such a coating method facilitates the formation of the hole injection layer 4. The solvent or disperse medium for the hole injection layer-forming material may be an inorganic solvent, an organic solvent or their mixture. For drying, the coating of the hole injection-forming material may be allowed to stand under atmospheric pressure or reduced pressure, or may be heated. An inert gas may be sprayed to the coating.

Before forming the hole injection layer 4, the upper surface of the anode 3 may be subjected to oxygen plasma treatment. This surface treatment may impart lyophilicity to the upper surface of the anode 3, remove organic deposit on the upper surface of the anode 3, and adjust the work function around the upper surface of the anode 3.

Preferably, the oxygen plasma treatment is performed, for example, at a plasma power of about 100 to 800 W and an oxygen gas flow rate of about 50 to 100 mL/min while the anode 3 (member to be treated) is transported at a speed of about 0.5 to 10 mm/s with the substrate 2 heated to about 70 to 90° C.

(3) Then, a hole transport layer 5 is formed on the hole injection layer 4. The hole transport layer 5 can be formed by a gas phase process using, for example, CVD or dry plating such as vacuum vapor deposition or sputtering.

Alternatively, the hole transport layer 5 may be formed by applying a hole transport layer-forming material onto the hole injection layer 4 and drying the material (removing the solvent or disperse medium). The hole transport layer-forming material can be prepared by dissolving a hole transport material in a solvent or dispersing it in a disperse medium.

(4) Then, a luminescent layer 6 is formed on the hole transport layer 5. The luminescent layer 6 can be formed by a gas phase process using dry plating such as vacuum vapor deposition.

(5) Then, an electron transport layer 7 is formed on the luminescent layer 6. The electron transport layer 7 can be formed by a gas phase process using dry plating such as vacuum vapor deposition.

(6) Then, an electron injection layer 8 is formed on the electron transport layer 7. If an inorganic material is used for the electron injection layer 8, it can be formed by, for example, a gas phase process using CVD or dry plating such as vacuum vapor deposition or sputtering, or coating and firing of an ink containing inorganic particles.

(7) Then, a cathode 9 is formed on the electron injection layer 8. The cathode 9 can be formed by, for example, vacuum vapor deposition, sputtering, metal foil bonding, or applying an ink containing metal particles and drying the ink.

(8) The anode 3, the multilayer composite 14 and the cathode 9 are covered with a sealing member 10, and the sealing member 10 is bonded to the substrate 2 to complete the light-emitting element 1.

The above-described light-emitting element 1 can be used in light-emitting devices such as light sources of the exposure heads of electrophotographic printers, copying machines and facsimile machines, light sources for sensors, illumination lamps, light sources for picoprojectors (handy projectors), light sources for scanners, and light sources for the front light of reflective liquid crystal display apparatuses. Since the light-emitting element of the light-emitting device has a long life, the light-emitting device can be reliable.

The light-emitting elements 1 may be arranged in a matrix manner for a display device. The display device can display high-quality images and can be reliable, over a long time. The display device may be operated by any technique without particular limitation. For example, the display device may be of active matrix type or passive matrix type.

Electronic apparatuses including the light-emitting element or the display device can also be reliable.

Figure 2:
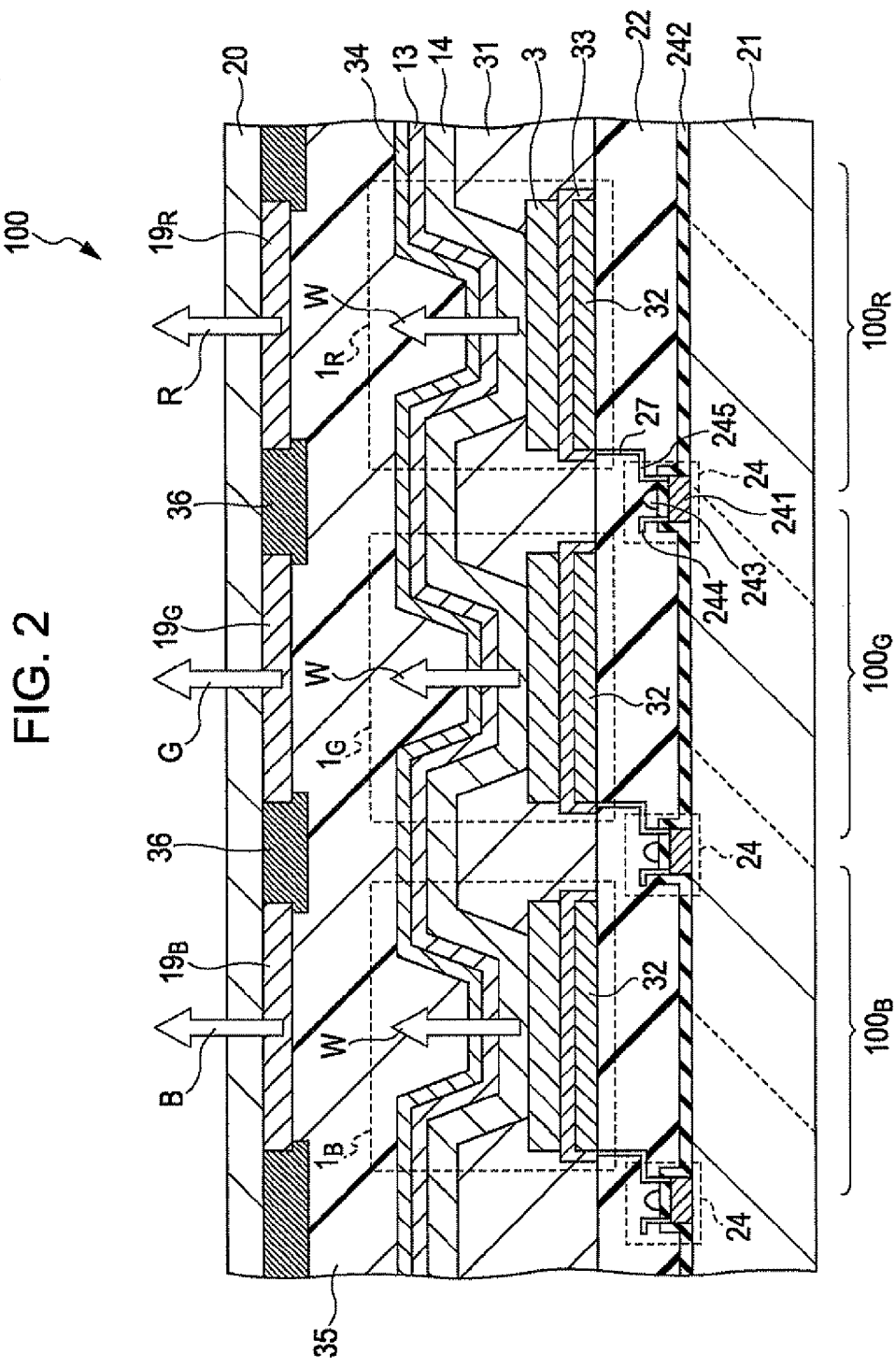
FIG. 2 is a sectional view of a display device according to an embodiment of the invention.

A display device of an embodiment of the invention will now be described. FIG. 2 is a vertical sectional view of a display device of an embodiment of the invention. The display device 100 shown in FIG. 2 includes a substrate 21, light-emitting elements $1_R$, $1_G$ and $1_B$ and color filters $19_R$, $19_G$ and $19_B$ that are provided corresponding to sub pixels $100_R$, $100_G$ and $100_B$ respectively, and driving transistors 24 that drive the corresponding light-emitting elements $1_R$, $1_G$ and $1_B$. In the present embodiment, the display device 100 is a top emission display panel.

The driving transistors 24 are disposed on the substrate 21, and a planarizing layer 22 made of an insulting material covers the driving transistors 24. Each driving transistor 24 includes a silicon semiconductor layer 241, a gate insulating layer 242 on the semiconductor layer 241, and a gate electrode 243, a source electrodes 244 and a drain electrode 245 that are formed on the gate insulating layer 242. Light-emitting elements $1_R$, $1_G$ and $1_B$ are disposed on the planarizing layer 22 so as to correspond to the driving transistors 24.

The light-emitting element $1_R$ includes a reflection film 32, an anti-corrosion film 33, an anode 3, a multilayer composite (organic EL emission portion) 14, a cathode 13, and a cathode cover 34 in that order from blow on the planarizing layer 22. The anode 3 of each of the light-emitting elements $1_R$, $1_G$ and $1_B$ acts as a pixel electrode and is electrically connected to the drain electrode 245 of the corresponding driving transistor 24 with a conductor portion (wire) 27. The cathode 13 of each of the light-emitting element $1_R$, $1_G$ and $1_B$ is their common electrode.

The light-emitting element $1_R$ shown in FIG. 2 emits white light W. For example, the luminescent layer of the light-emitting element $1_R$ is defined by a multilayer composite including a luminescent layer that emits red light, a luminescent layer that emits blue light and a luminescent layer that emits green light, or a multilayer composite including a luminescent layer that emits blue light and a luminescent layer that emits yellow light.

The structure of the other light-emitting elements $1_G$ and $1_B$ is the same as that of the light-emitting element $1_R$. In FIG. 2, the same parts as in FIG. 1 are designated by the same reference numerals. The structure and characteristics of the reflection film 32 may be different among the light-emitting elements $1_R$, $1_G$ and $1_B$ according to the wavelength of light. The light-emitting elements $1_R$, $1_G$ and $1_B$ are separated from one another by a partition member 31. The light-emitting elements $1_R$, $1_G$ and $1_B$ are covered with an epoxy resin layer 35.

The color filters $19_R$, $19_G$ and $19_B$ are disposed on the epoxy resin layer 35 corresponding to the light-emitting elements $1_R$, $1_G$ and $1_B$.

The color filter $19_R$ changes the white light W from the light-emitting element $1_R$ into red light. The color filter $19_G$ changes the white light W from the light-emitting element $1_G$ into green light. The color filter $19_B$ changes the white light W from the light-emitting element $1_B$ into blue light. By using these color filters $19_R$, $19_G$ and $19_B$ in combination, the light-emitting elements $1_R$, $1_G$ and $1_B$ can display full color images.

The color filters $19_R$, $19_G$ and $19_B$ are separated from each other by a light-shielding layer 36. Unintended sub pixels of the sub pixels $100_R$, $100_G$ and $100_B$ thus can be prevented from emitting light. The color filters $19_R$, $19_G$ and $19_B$ and the light-shielding layer 36 are covered with a sealing substrate 20.

The display device 100 may display monochrome images, or may display color images by using appropriate luminescent materials in the light-emitting elements $1_R$, $1_G$ and $1_B$. The display device 100 according to an embodiment of the invention can be incorporated in various types of electronic apparatuses.

Figure 3:
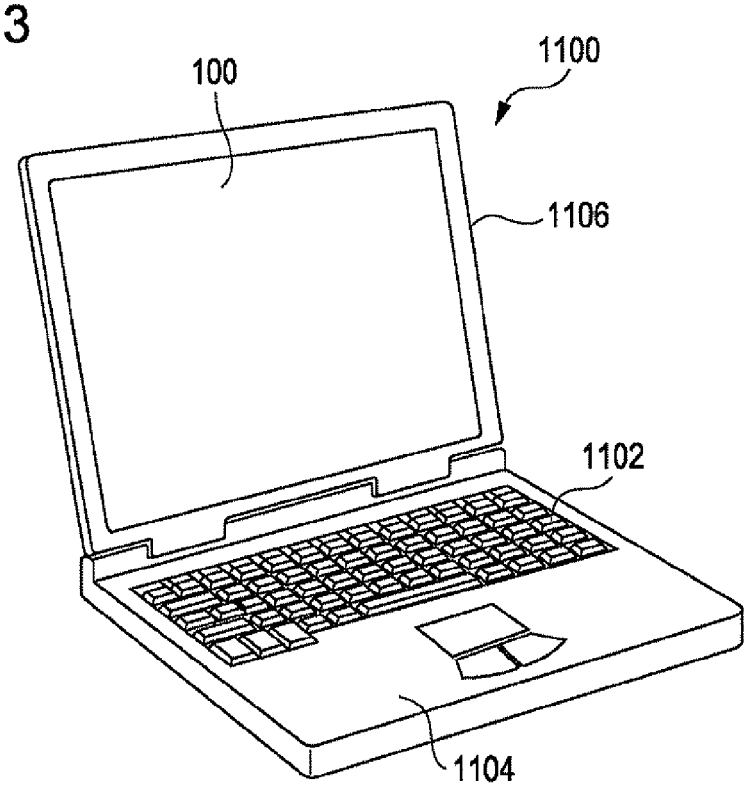
FIG. 3 is a perspective view of a mobile or notebook personal computer to which an embodiment of the electronic apparatus of the invention has been applied.

FIG. 3 is a perspective view of a mobile or notebook personal computer to which an embodiment of the electronic apparatus of the invention has been applied. In FIG. 3, the personal computer 1100 includes a body 1104 with a key board 1102, and a display unit 1106 having a display portion. The display unit 1106 is rotatably secured to the body 1104 with a hinge structure. The display portion of the display unit 1106 includes the display device 100 described above.

Figure 4:
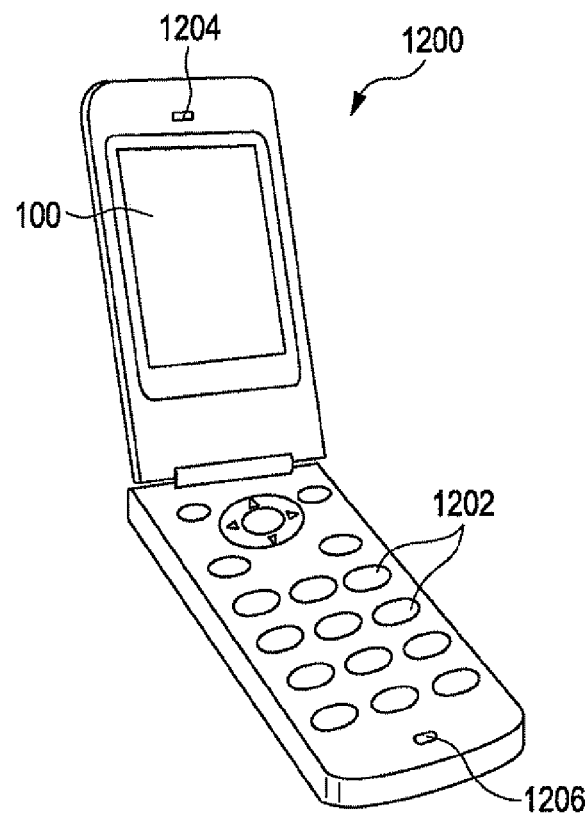
FIG. 4 is a perspective view of a mobile phone to which an embodiment of the electronic apparatus of the invention has been applied.

FIG. 4 is a perspective view of a mobile phone to which an embodiment of the electronic apparatus of the invention has been applied. In FIG. 4, the mobile phone 1200 includes a plurality of control buttons 1202, a receiver 1204, a microphone 1206, and a display portion. The display portion includes the above-described display device 100.

Figure 5:
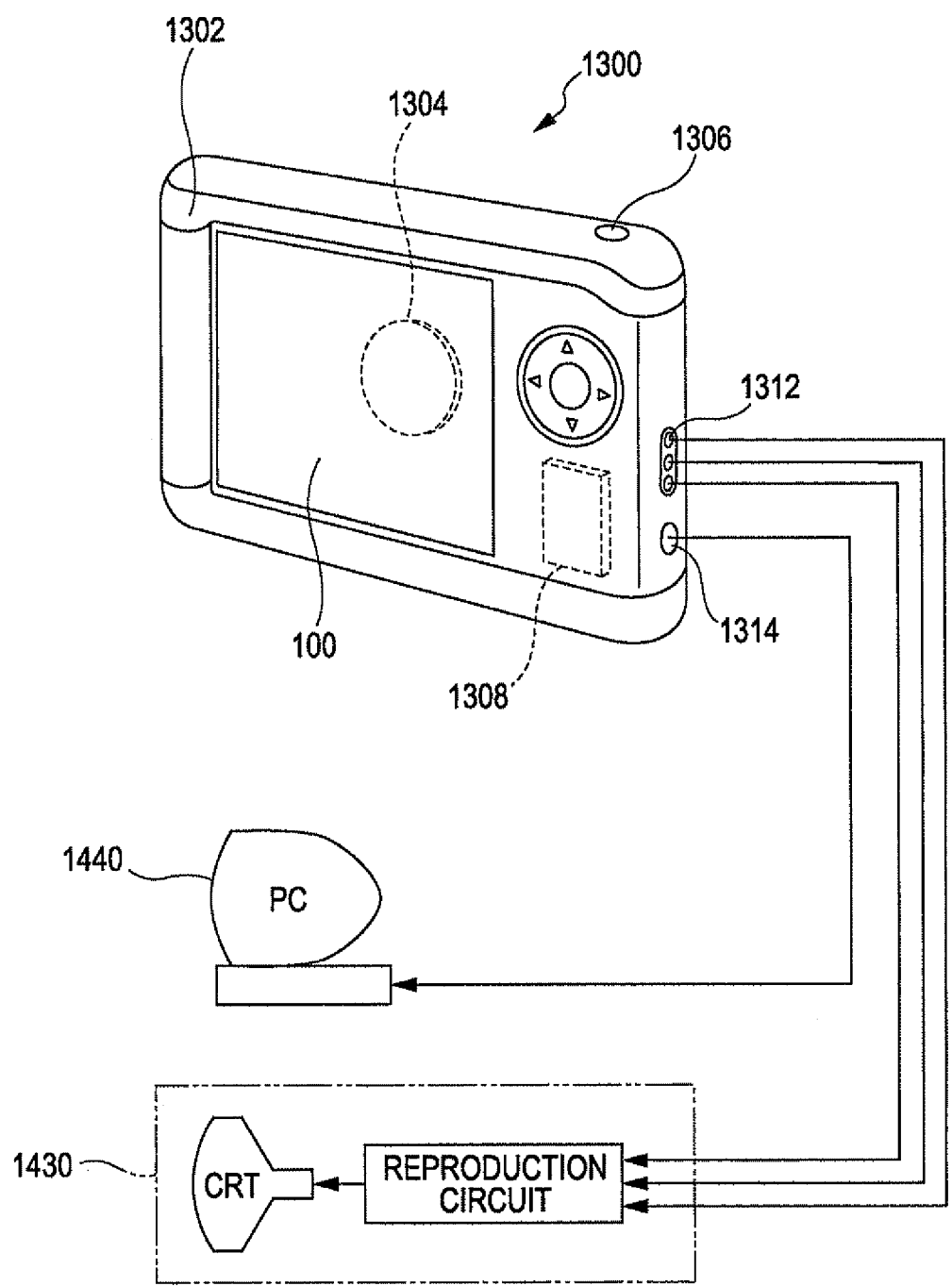
FIG. 5 is a perspective view of a digital still camera to which an embodiment of the electronic apparatus of the invention has been applied.

FIG. 5 is a perspective view of a digital still camera to which an embodiment of the electronic apparatus of the invention has been applied, including the above-described display device. FIG. 5 schematically shows the connection between the electronic apparatus and external devices. While conventional cameras expose a silver halide photographic film with the optical image of an object, the digital still camera 1300 converts an optical image of an object into electrical signals with a CCD (Charge Coupled Device) to produce an image pickup signal (an image signal). The digital still camera 1300 includes a case or body 1302 and a display portion on the rear side of the body 1302. The display portion is configured to display images according to image pickup signals of the CCD, and functions as a finder to display an object as an electronic image. In the digital still camera 1300, the display portion includes the above-described display device 100.

A circuit board 1308 is disposed within the case 1302. The circuit board 1308 includes a memory device in which image pickup signals are stored. A light-receiving unit 1304 including an optical lens (image pickup optical system) and a CCD is disposed on the front side of the case 1302 (rear side of the figure). The user makes sure that an object to be taken is appropriately displayed on the display portion, and presses the shutter button 1306. Then the image pickup signal at that time of the CCD is transmitted to be stored to the memory device on the circuit board 1308.

The digital still camera 1300 is provided with a video signal output terminal 1312 and a data communication input terminal 1314 on a side of the case 1302. The video signal output terminal 1312 is connected to a television monitor 1430, and the data communication input terminal 1314 is connected to a personal computer 1440. The image pickup signals stored in the memory device of the circuit board 1308 are output to the television monitor 1430 or the personal computer 1440 by a predetermined operation.

The electronic apparatuses according to embodiments of the invention can be applied to television sets, video cameras, viewfinder-type or monitor-direct-view-type video tape recorders, car navigation systems, pagers, electronic notebooks (may have a communication function), electronic dictionaries, electronic calculators, electronic game machines, word processors, work stations, video phones, security video monitors, electronic binoculars, POS terminals, apparatuses with a touch panel such as cash dispensers and automatic ticket vending machines, medical instruments such as electronic thermometers, blood-pressure meters, blood glucose meters, electrocardiographic monitors, ultrasonographs and endoscope monitors, fishfinders, and other measuring apparatuses or meters for vehicles, planes and ships, flight simulators, other monitors, and projection monitors such as projectors, in addition to the personal computer (mobile personal computer or notebook personal computer) shown in FIG. 3, the mobile phone shown in FIG. 4, and the digital still camera shown in FIG. 5.

Although the light-emitting element, the light-emitting device, the display device, and the electronic apparatus have been described with reference to embodiments shown in the drawings, the invention is not limited to the disclosed embodiments.

EXAMPLES

Examples of the invention will now be described.

Example 1

(1) First, a transparent glass substrate having an average thickness of 0.5 mm was prepared. Then, an ITO electrode (anode) was formed to an average thickness of 150 nm on the substrate by sputtering. After being subjected to ultrasonic cleaning in acetone and 2-propanol in that order, the resulting substrate was treated with oxygen plasma and argon plasma. The treatments with these plasmas were each performed at a plasma power of 100 W and a gas flow rate of 20 sccm for 5 seconds with the substrate heated to 70 to 90° C.

(2) Subsequently, a hole injection layer having an average thickness of 20 nm was formed on the ITO electrode by vacuum vapor codeposition of the benzidine derivative (hole injection material) expressed by formula (1) and the anthracene derivative (electron transport material) expressed by the following formula (10). In this Example, the hole injection layer was made of a mixture of the benzidine derivative (hole injection material) expressed by formula (1) and the anthracene derivative (electron transport material) expressed by formula (10). The weight ratio of the benzidine derivative to the anthracene derivative was 40:60.

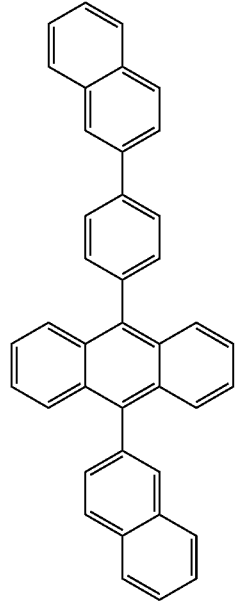

(10)

(3) Subsequently, a hole transport layer having an average thickness of 50 nm was formed on the hole injection layer by vacuum vapor codeposition of the benzidine derivative (hole transport material) expressed by formula (2) and the anthracene derivative (electron transport material) expressed by formula (10). In this Example, the hole transport layer was made of a mixture of the benzidine derivative (hole transport material) expressed by formula (2) and the anthracene derivative (electron transport material) expressed by formula (10). The weight ratio of the benzidine derivative to the anthracene derivative was 60:40.

(4) Subsequently, materials of the red luminescent layer were deposited on the hole transport layer by vacuum vapor deposition, thus forming a red luminescent layer having an average thickness of 40 nm. The red luminescent layer contains the tetraaryldiindenoperylene derivative expressed by formula (3) as the red luminescent material (guest material or dopant) and the naphthacene derivative expressed by formula (7) as the host material. The luminescent material content (dopant concentration) in the red luminescent layer was 1.0% by weight.

(5) Subsequently, tris(8-quinolinolato) aluminum (Alq$_3$) expressed by formula (8) was deposited on the red luminescent layer by vacuum vapor deposition, thus forming a first electron transport layer having an average thickness of 5 nm.

(6) Then, the azaindolizine derivative expressed by formula (9) was deposited on the first electron transport layer by vacuum vapor deposition, thus forming a second electron transport layer having an average thickness of 25 nm. Thus an electron transport layer including the first electron transport layer and the second electron transport layer was formed.

(7) Subsequently, lithium fluoride (LiF) was deposited on the second electron transport layer by vacuum vapor deposition, thus forming an electron injection layer having an average thickness of 1 nm.

(8) Then, Al was deposited on the electron injection layer by vacuum vapor deposition, thus forming a cathode having an average thickness of 150 nm.

(9) A glass protective cover (sealing member) was provided to cover and seal the resulting layers, and fixed with an epoxy resin. A light-emitting element was thus completed.

Example 2

A light-emitting element was produced in the same manner as in Example 1 except that the weight ratio of the benzidine derivative to the anthracene derivative in the hole injection layer was set to 30:70.

Example 3

A light-emitting element was produced in the same manner as in Example 1 except that the weight ratio of the benzidine derivative to the anthracene derivative in the hole injection layer was set to 50:50.

Example 4

A light-emitting element was produced in the same manner as in Example 1 except that the weight ratio of the benzidine derivative to the anthracene derivative in the hole transport layer was set to 70:30.

Example 5

A light-emitting element was produced in the same manner as in Example 1 except that the hole injection layer was formed to an average thickness of 50 nm, and the hole transport layer was formed to an average thickness of 20 nm.

Example 6

A light-emitting element was produced in the same manner as in Example 1 except that the hole injection layer was formed to an average thickness of 20 nm by vacuum vapor codeposition of the benzidine derivative (hole transport material) expressed by formula (2) and the anthracene derivative (electron transport material) expressed by formula (10) in a ratio of 40:60 (benzidine derivative:anthracene derivative).

Comparative Example

A light-emitting element was produced in the same manner as in Example 1 except that an anthracene derivative (electron transport material) was not added to the hole injection layer and the hole transport layer.

Evaluations

1. Emission Lifetime

The luminance of each of the above Examples and Comparative Example was measured with a luminance meter while a constant current with such a current density as the initial luminance would be 60000 cd/m$^2$ was applied to the light-emitting element from a direct power source. The time (LT90) until the luminance was reduced to 90% of the initial luminance was measured. The LT90 of each Example was normalized with that of Comparative example and relatively evaluated.

2. Luminous Efficiency

A current was applied to each light-emitting element of the above Examples and Comparative Example from a direct power source so that the luminance became 60000 cd/m$^2$ while the luminance was measured with a luminance meter, and the current at that time was measured. Similarly, the driving voltage applied to the light-emitting element was measured.

3. Emission Balance

A current was applied to each light-emitting element of the above Examples and Comparative Example from a direct power source so that the luminance became 60000 cd/m$^2$ while the luminance was measured with a luminance meter, and the chromaticity at that time was measured with a colorimeter.

FIG. 6 is a table showing the compositions of the hole injection layer and the hole transport layer of each of the light-emitting elements of Examples and Comparative Example, and the results of evaluations of emission characteristics. The results of revaluations are shown in the table shown in FIG. 6.

As is clear from the table shown in FIG. 6, the light-emitting elements of Examples of the invention exhibited much longer lives than the light-emitting element of Comparative Example. In addition, the light-emitting elements of Examples emitted light at substantially the same driving voltage and current density as the light-emitting element of Comparative Example, and exhibited high luminous efficiency. The light-emitting elements of Examples 1 to 5 emitted light with substantially the same chromaticity as the light-emitting element of Comparative Example, and produced a desired emission color. Furthermore, even though the hole injection layer and the hole transport layer were made of the same composition, as in Example 6, the light-emitting element produced the same effect as in Examples 1 to 5.

This application claims priority from Japanese Patent Application No. 2011-047273 filed in the Japanese patent office on Mar. 4, 2011, the entire disclosure of which is hereby incorporated by reference in its entirely.

What is claimed is:

1. A light-emitting element comprising:
an anode;
a cathode;
a luminescent layer disposed between the anode and the cathode; and
an organic layer functioning to transport holes and disposed between the anode and the luminescent layer, the organic layer including a hole injection layer in contact with the anode and containing a hole injection material and an electron transport material, and a hole transport layer in contact with the hole injection layer and the luminescent layer and containing a hole transport material and an electron transport material,
wherein the content of the electron transport material in the hole injection layer is different from the electron transport material in the hole transport layer.

2. The light-emitting element according to claim 1, wherein the organic layer functions to block electrons.

3. The light-emitting element according to claim 2, wherein the electron transport material content in the hole transport layer is lower than the electron transport material in the hole injection layer.

4. The light-emitting element according to claim 3, wherein the hole transport layer has a larger average thickness than the hole injection layer.

5. The light-emitting element according to claim 4, wherein the electron transport material in the hole transport layer and the electron transport material in the hole injection layer are each an acene-based material.

6. The light-emitting element according to claim 5, wherein the organic layer contains an amine-based material.

7. The light-emitting element according to claim 6, wherein the organic layer contains a mixture of the acene-based material and the amine-based material.

8. The light-emitting element according to claim 5, wherein the acene-based material is at least one of an anthracene-based material and a naphthacene-based material.

9. The light-emitting element according to claim 1, wherein the hole transport material in the hole injection layer is the same as the electron transport material in the hole transport layer.

10. The light-emitting element according to claim 1, wherein the electron transport material content in the hole injection layer and the electron transport material content in the hole transport layer are each in the range of 30% to 70% by weight.

11. The light-emitting element according to claim 1, wherein the organic layer has an average thickness in the range of 20 to 100 nm.

12. A light-emitting device comprising the light-emitting element as set forth in claim 1.

13. A light-emitting device comprising the light-emitting element as set forth in claim 5.

14. A light-emitting device comprising the light-emitting element as set forth in claim 6.

15. A light-emitting device comprising the light-emitting element as set forth in claim 7.

16. A display device comprising the light-emitting device as set forth in claim 12.

17. An electronic apparatus comprising the display device as set forth in claim 16.

18. The light-emitting element according to claim 1, wherein electrons are transported from the luminescent layer through the electron transport material in the hole transport layer, then through the electron transport material in the hole injection layer, then to the anode.

* * * * *